(12) United States Patent
Park et al.

(10) Patent No.: US 11,693,254 B2
(45) Date of Patent: Jul. 4, 2023

(54) LIGHT FIELD DISPLAY DEVICE HAVING IMPROVED VIEWING ANGLE (71) Applicant: LG Display Co., Ltd., Seoul (KR)

(72) Inventors: Ju-Seong Park, Paju-si (KR);
Myung-Soo Park, Paju-si (KR);
Dong-Yeon Kim, Paju-si (KR);
Young-Min Kim, Paju-si (KR);
Se-Wan Oh, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 17/473,121

(22) Filed: Sep. 13, 2021

(65) Prior Publication Data
US 2022/0206313 A1 Jun. 30, 2022

(30) Foreign Application Priority Data

Dec. 30, 2020 (KR) .................. 10-2020-0187274

(51) Int. Cl.
G02B 30/10 (2020.01)
G02F 1/1335 (2006.01)
H01L 33/58 (2010.01)
G02B 30/27 (2020.01)
G02B 30/30 (2020.01)
H01L 25/075 (2006.01)
H10K 50/858 (2023.01)
G02F 1/1368 (2006.01)
H10K 59/12 (2023.01)

(52) U.S. Cl.
CPC ............ *G02B 30/10* (2020.01); *G02B 30/27* (2020.01); *G02B 30/30* (2020.01); *G02F 1/133512* (2013.01); *G02F 1/133526* (2013.01); *H01L 25/0753* (2013.01); *H01L 33/58* (2013.01); *H10K 50/858* (2023.02); *G02F 1/1368* (2013.01); *H10K 59/12* (2023.02)

(58) Field of Classification Search
CPC ........ G02B 30/10; G02B 30/27; G02B 30/30; G02F 1/133512; G02F 1/133526; G02F 1/1368; H01L 25/0753; H01L 33/58; H01L 51/5275; H01L 27/3244; H10K 50/858; H10K 59/12
USPC .......................................... 349/15
See application file for complete search history.

(56) References Cited

U.S. PATENT DOCUMENTS

| 8,786,791 B2 * | 7/2014 | Fang | G02F 1/133606 349/62 |
| 2013/0335537 A1 * | 12/2013 | Goro | H04N 13/302 348/54 |
| 2014/0292732 A1 * | 10/2014 | Niioka | G09G 3/3648 345/204 |
| 2018/0284465 A1 * | 10/2018 | Kwon | H01L 25/0753 |

* cited by examiner

*Primary Examiner* — Charles S Chang
(74) *Attorney, Agent, or Firm* — Fenwick & West LLP (57) ABSTRACT A light field display device including: a display panel including a plurality of subpixels each emitting a light field; and a lenticular lens array on the display panel and including a plurality of lenticular lenses, wherein the plurality of lenticular lenses correspond to a plurality of subpixel groups each including the plurality of subpixels, and wherein a width of each of the plurality of subpixel groups is greater than a width of each of the plurality of lenticular lenses.

17 Claims, 11 Drawing Sheets

LIGHT FIELD DISPLAY DEVICE HAVING IMPROVED VIEWING ANGLE

CROSS-REFERENCE TO RELATED APPLICATION

The present application claims the priority benefit of Korean Patent Application No. 10-2020-0187274 filed on Dec. 30, 2020, which is hereby incorporated by reference in its entirety.

BACKGROUND

Field of the Disclosure

The present disclosure relates to a light field display device, and more particularly, to a light field display device having an improved viewing angle.

Description of the Background

Recently, as three-dimensional content is provided, a three-dimensional (3D) display device has been widely supplied. Most of the three-dimensional display devices use a stereoscopic method where a perceptional depth is obtained by supplying different images to two eyes of a user. However, in the stereoscopic method, only information on binocular parallax is transmitted to the user, while a monocular parameter for perceptional depth such as focus control and motion parallax is not transmitted to the user. As a result, a three-dimensional image becomes unnatural and a fatigue of an eye is caused.

SUMMARY

Accordingly, the present disclosure is directed to a light field display device that substantially obviates one or more of the problems due to limitations and disadvantages of the background art.

Also, the present disclosure is to provide a light field display device having an improved viewing angle.

In addition, the present disclosure is to provide a light field display device where a distortion of an image due to difference in resolution of horizontal and vertical directions is prevented.

Further, the present disclosure is to provide a light field display device where a three-dimensional crosstalk in right and left viewing angles is prevented.

Additional features and advantages of the disclosure will be set forth in the description which follows, and in part will be apparent from the description, or may be learned by practice of the disclosure. These and other advantages of the disclosure will be realized and attained by the structure particularly pointed out in the written description and claims hereof as well as the appended drawings.

To achieve these and other advantages and in accordance with the purpose of the present disclosure, as embodied and broadly described herein, a light field display device including: a display panel including a plurality of subpixels each emitting a light field; and a lenticular lens array on the display panel and including a plurality of lenticular lenses, wherein the plurality of lenticular lenses correspond to a plurality of subpixel groups each including the plurality of subpixels, and wherein a width of each of the plurality of subpixel groups is greater than a width of each of the plurality of lenticular lenses.

It is to be understood that both the foregoing general description and the following detailed description are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this specification, illustrate aspects of the disclosure and together with the description serve to explain the principles of the disclosure. In the drawings.

DETAILED DESCRIPTION

Reference will now be made in detail to aspects of the present disclosure, examples of which may be illustrated in the accompanying drawings. In the following description, when a detailed description of well-known functions or configurations related to this document is determined to unnecessarily cloud a gist of the inventive concept, the detailed description thereof will be omitted. The progression of processing steps and/or operations described is an example; however, the sequence of steps and/or operations is not limited to that set forth herein and may be changed as is known in the art, with the exception of steps and/or operations necessarily occurring in a particular order. Like reference numerals designate like elements throughout. Names of the respective elements used in the following explanations are selected only for convenience of writing the specification and may be thus different from those used in actual products.

Advantages and features of the present disclosure, and implementation methods thereof will be clarified through following example aspects described with reference to the accompanying drawings. The present disclosure may, however, be embodied in different forms and should not be construed as limited to the example aspects set forth herein. Rather, these example aspects are provided so that this disclosure may be sufficiently thorough and complete to assist those skilled in the art to fully understand the scope of the present disclosure. Further, the present disclosure is only defined by scopes of claims.

A shape, a size, a ratio, an angle, and a number disclosed in the drawings for describing aspects of the present disclosure are merely an example. Thus, the present disclosure is not limited to the illustrated details. Like reference numerals refer to like elements throughout. In the following description, when the detailed description of the relevant known function or configuration is determined to unnecessarily obscure an important point of the present disclosure, the detailed description of such known function or configuration may be omitted. In a case where terms "comprise," "have," and "include" described in the present specification are used, another part may be added unless a more limiting term, such as "only," is used. The terms of a singular form may include plural forms unless referred to the contrary.

In construing an element, the element is construed as including an error or tolerance range even where no explicit description of such an error or tolerance range. In describing a position relationship, when a position relation between two parts is described as, for example, "on," "over," "under," or "next," one or more other parts may be disposed between the two parts unless a more limiting term, such as "just" or "direct(ly)," is used.

In describing a time relationship, when the temporal order is described as, for example, "after," "subsequent," "next," or "before," a case which is not continuous may be included unless a more limiting term, such as "just," "immediate(ly)," or "direct(ly)," is used.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

In describing elements of the present disclosure, the terms like "first," "second," "A," "B," "(a)," and "(b)" may be used. These terms are merely for differentiating one element from another element, and the essence, sequence, order, or number of a corresponding element should not be limited by the terms. Also, when an element or layer is described as being "connected," "coupled," or "adhered" to another element or layer, the element or layer can not only be directly connected or adhered to that other element or layer, but also be indirectly connected or adhered to the other element or layer with one or more intervening elements or layers "disposed" between the elements or layers, unless otherwise specified.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

In the description of aspects, when a structure is described as being positioned "on or above" or "under or below" another structure, this description should be construed as including a case in which the structures contact each other as well as a case in which a third structure is disposed therebetween. The size and thickness of each element shown in the drawings are given merely for the convenience of description, and aspects of the present disclosure are not limited thereto.

Features of various aspects of the present disclosure may be partially or overall coupled to or combined with each other, and may be variously inter-operated with each other and driven technically as those skilled in the art can sufficiently understand. Aspects of the present disclosure may be carried out independently from each other, or may be carried out together in co-dependent relationship.

Reference will now be made in detail to the present disclosure, examples of which are illustrated in the accompanying drawings.

The present disclosure provides a light field display device. In general, a three-dimensional (3D) display device may be classified into a stereoscopic type, an auto-stereoscopic type and a hologram type.

In the stereoscopic type 3D display device, a user may have inconvenience of putting on glasses and a watch fatigue such as dizziness.

In the auto-stereoscopic type 3D display device, a parallax between right and left eyes is generated using a parallax barrier or a lenticular lens, and right and left images are transmitted to right and left eyes, respectively, of a user. The user recognizes a three-dimensional image by combining the right and left images. However, the user may have watch fatigue such as dizziness. In addition, the user may have poor perceptional depth of a three-dimensional image and the color of a three-dimensional may be distorted.

In the hologram type 3D display device, since a light wave emitted from an object is intactly written and reproduced, a three-dimensional image completely the same as the real object may be generated. As a result, the hologram type 3D display device is a complete 3D display device. However, since there exists a technical limitation in a three-dimensional image of a hologram, commercialization of the hologram type 3D display device still has a long way to full maturity.

A light field display device may generate a three-dimensional image similar to a hologram. In the light field display device, a three-dimensional image is generated by reproducing a distribution of rays. Since hologram technology records phase information as well as color and intensity of rays, light information without a loss is recorded and a perfect three-dimensional image having various views of an object is obtained.

In the light field display device, information of a color, an intensity and a direction of rays is recorded. Although recorded information and reproduced information do not include phase information, objects disposed with different distances are recorded at different positions. As a result, when a position of pixels of an image sensor and a position of a lens array are known, a three-dimensional image may be generated by restoring the direction information of incident rays from the recorded image.

Figure 1A:
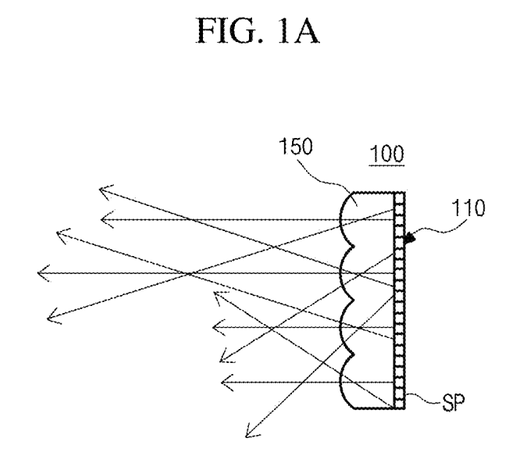
FIG. 1A is a view showing a light field display device according to a first aspect of the present disclosure.
Figure 1B:
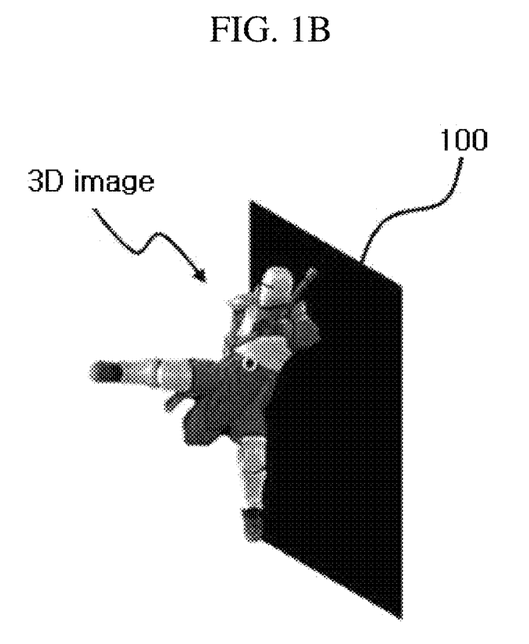
FIG. 1B is a view showing a three-dimensional image displayed by a light field display device according to a first aspect of the present disclosure.

FIG. 1A is a view showing a light field display device according to a first aspect of the present disclosure, and FIG. 1B is a view showing a three-dimensional image displayed by a light field display device according to a first aspect of the present disclosure.

In FIG. 1A, a light field display device 100 includes a display panel 110 and a lenticular lens array 150 on a front surface of the display panel 110.

The display panel 110 may be one of a liquid crystal display panel, an organic light emitting diode (OLED) display panel, a plasma display panel (PDP), an electrophoretic display panel, a quantum dot display panel, a mini light emitting diode (LED) display panel and a micro light emitting diode (LED) display panel. It is not limited thereto and the display panel 110 may be all display panels.

The display panel 110 includes a plurality of subpixels SP, and an image is emitted from each of the plurality of subpixels SP. The plurality of subpixels SP may include red, green and blue subpixels.

The images from the plurality of subpixels SP are shot along different directions. The images entering right and left eyes of a user have different ray information (for example, an intensity, a color and a direction of the image). A three-dimensional (3D) image is generated due to the different ray information.

The lenticular lens array 150 includes a plurality of lenticular lenses. Each of the plurality of lenticular lenses extends along a first direction (for example, y direction) and the plurality of lenticular lenses are disposed along a second direction (for example, x direction). The lenticular lens array 150 may be formed directly on the display panel 110 or may be formed on an additional transparent substrate.

Although the lenticular lens array 150 has a bottom surface of a straight line shape and a top surface of a round lens shape in FIG. 1A, a whole of the lenticular lens array 150 may have a round lens shape in another aspect. Although the lenticular lens array 150 may include a transparent plastic material, it is not limited thereto.

In the light field display device 100, the images from the plurality of subpixels SP are divided by the lenticular lens array 150 and the images having different ray information enter the right and left eyes of the user. Specifically, in the light field display device 100, since the ray information of the images entering the right and left eyes of the user includes a direction information, the user may recognize a three-dimensional image similar to a hologram as shown in FIG. 1B.

The light field display device according to the present disclosure is illustrated hereinafter.

Figure 2:
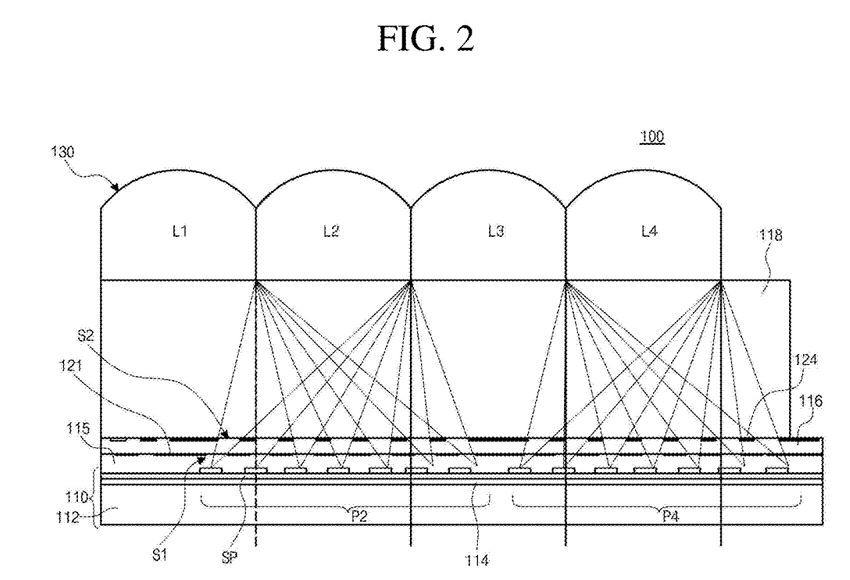
FIG. 2 is a view showing a light field display device according to a first aspect of the present disclosure.

FIG. 2 is a view showing a light field display device according to a first aspect of the present disclosure.

In FIG. 2, a light field display device 100 according to a first aspect of the present disclosure includes a display panel 110 having a plurality of subpixels SP and a lenticular lens array 130 on the display panel 110.

The display panel 110 includes a substrate 112 of a transparent material such as a glass or a plastic, a buffer layer 114 on the substrate 112 and the plurality of subpixels SP on the buffer layer 114.

The display panel 110 may be one of a liquid crystal display (LCD) panel, an organic light emitting diode (OLED) display panel, a plasma display panel (PDP), an electrophoretic display panel, a quantum dot display panel, a mini light emitting diode (LED) display panel and a micro light emitting diode (LED) display panel.

Although not shown, a plurality of gate lines and a plurality of data lines are disposed along a horizontal direction and a vertical direction to define the plurality of subpixels SP.

When the display panel 110 is an LCD panel, a thin film transistor (TFT) of a switching element selectively applying a signal to each subpixel SP due to switching may be disposed at crossing of the gate line and the data line on the substrate 112. The TFT may include a gate electrode connected to the gate line, a semiconductor layer including amorphous silicon, crystalline silicon or an oxide semiconductor on the gate electrode, a source electrode connected to the data line on the semiconductor layer and a drain electrode connected to a pixel electrode on the semiconductor layer.

A liquid crystal layer and a pixel electrode and a common electrode applying an electric field to the liquid crystal layer are disposed in each subpixel SP. The pixel electrode is connected to the drain electrode of the TFT, and an image signal is applied to the pixel electrode due to a turn-on of the TFT to generate an electric field in the liquid crystal layer with the common electrode.

In addition, red, green and blue color filters are disposed in each subpixel SP to display a corresponding color.

When the display panel 110 is an OLED display panel, a light emitting diode may be disposed in each subpixel SP. The light emitting diode may include an anode connected to the drain electrode of the TFT and receiving an image signal through the TFT, a light emitting layer on the anode and a cathode on the light emitting layer and the entire display panel 110.

When the display panel 110 is an electrophoretic display panel, a pixel electrode connected to the drain electrode of the TFT and receiving an image signal through the TFT, an electrophoretic layer on the pixel electrode and a common electrode on the electrophoretic layer.

When the display panel 110 is a quantum dot display panel, a pixel electrode connected to the drain electrode of the TFT and receiving an image signal through the TFT, a quantum dot layer on the pixel electrode and a common electrode on the quantum dot layer.

When the display panel 110 is a mini LED display panel or a micro LED display panel, a mini LED or a micro LED may be disposed in each subpixel SP.

The plurality of subpixels SP may constitute a plurality of subpixel groups P2 and P4. Each subpixel group P2 and P4 may include a plurality of red, green and blue subpixels SP alternately repeated.

Each subpixel SP of the plurality of subpixel groups P2 and P4 reproduces a light field. For example, since seven subpixels SP are disposed in each subpixel group P2 and p4, seven light fields may be reproduced. For convenience of illustration, seven subpixels SP are disposed in each subpixel group P2 and P4 in FIG. 2. Each subpixel group P2 and P4 may include subpixels SP smaller than seven or greater than eight in another aspect.

First, second, third and fourth lenticular lenses L1, L2, L3 and L4 are repeatedly disposed in the lenticular lens array 130.

Each subpixel group P2 and P4 corresponds to each lenticular lens L2 and L4. Although not shown, the plurality of subpixel groups include four subpixel groups, and the four subpixel groups correspond to the first, second, third and fourth lenticular lenses L1, L2, L3 and L4.

The light field (i.e., the image) emitted from the second subpixel group P2 passes through the second lenticular lens L2, and the light field emitted from the fourth subpixel group P4 passes through the fourth lenticular lens L4. Although not shown, the light field emitted from the first subpixel group passes through the first lenticular lens L1, and the light field emitted from the third subpixel group passes through the third lenticular lens L3.

The light passing through the first, second, third and fourth L1, L2, L3 and L4 enters the eyes of the user at various viewing points such that the user recognizes the three-dimensional image.

A width of the subpixel group P2 and P4 is different from a width of the lenticular lens L2 and L4. For example, a width of the subpixel group P2 and P4 may be greater than a width of the lenticular lens L2 and L4. When the second subpixel group P2 includes seven subpixels SP, four subpixels SP are disposed in a region corresponding to the second lenticular lens L2 and three subpixels SP are disposed in a region corresponding to the first and third lenticular lenses L1 and L3.

However, the subpixel group P2 and P4 is not limited thereto. For example, the subpixel group P2 and P4 may include eight subpixels SP. Four subpixels SP may be disposed in a region corresponding to the second lenticular lens L2 and two subpixels SP may be disposed in a region corresponding to each of the first and third lenticular lenses L1 and L3.

In addition, the subpixel group P2 and P4 may include fourteen subpixels SP. Seven subpixels SP may be disposed in a region corresponding to the second lenticular lens L2 and seven subpixels SP may be disposed in a region corresponding to the first and third lenticular lenses L1 and L3.

Each subpixel group P2 and P4 may include various numbers of subpixels SP according to a number of viewpoints. A number of the subpixels SP disposed in a region corresponding to a facing lenticular lens and a number of subpixels SP disposed in a region corresponding to an adjacent lenticular lens may be variously determined.

The width of the subpixel group P2 and P4 is greater than the width of the lenticular lens L2 and L4 for improving a viewing angle of the light field display device 100.

The viewing angle of the light field display device 100 may correspond to a region where a user watches a three-dimensional image. The narrow viewing angle may mean a narrow region where the user can watch the three-dimensional image. As a result, in the display device such as a television where many users watch the image at the same time, it is required to improve the viewing angle.

The viewing angle may be determined according to a pitch and a focus of the lenticular lenses L1, L2, L3 and L4. As a result, to improve the viewing angle, the lenticular lenses L1, L2, L3 and L4 should be re-designed such that the pitch and the focus are adjusted. However, when the lenticular lenses L1, L2, L3 and L4 are re-designed, the subpixel SP of the display panel 110 should be also re-designed. Further, the re-design of the lenticular lenses L1, L2, L3 and L4 has a limit in improvement of the viewing angle.

In the light field display device 100 according to a first aspect of the present disclosure, the viewing angle is improved by re-arranging the subpixel SP without re-design of the lenticular lenses L1, L2, L3 and L4. Specifically, since the subpixel SP of the subpixel group P1 and P3 reproducing the light field is disposed to correspond to an adjacent region as well as the lenticular lenses L1, L2 and L3, the viewing angle is improved.

Figure 3A:
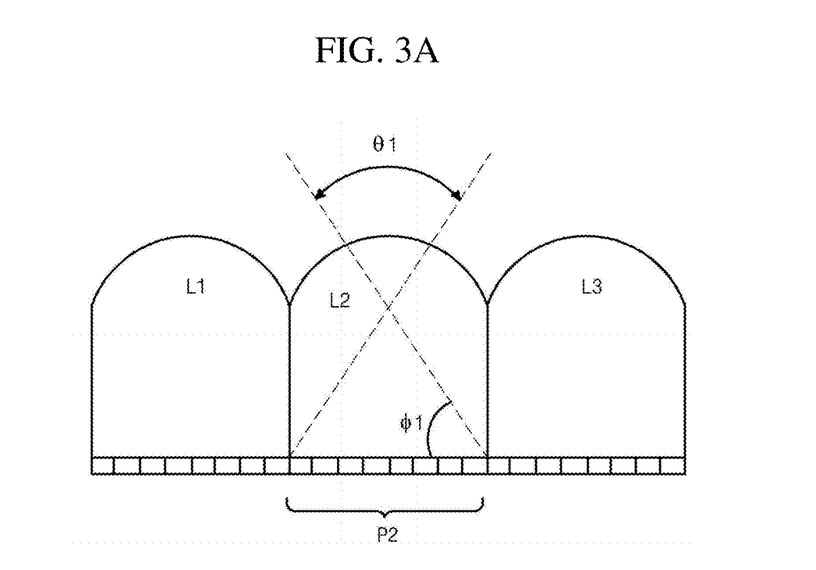
FIG. 3A is a view showing a second subpixel group in a region under a second lenticular lens of a light field display device according to a comparison example.
Figure 3B:
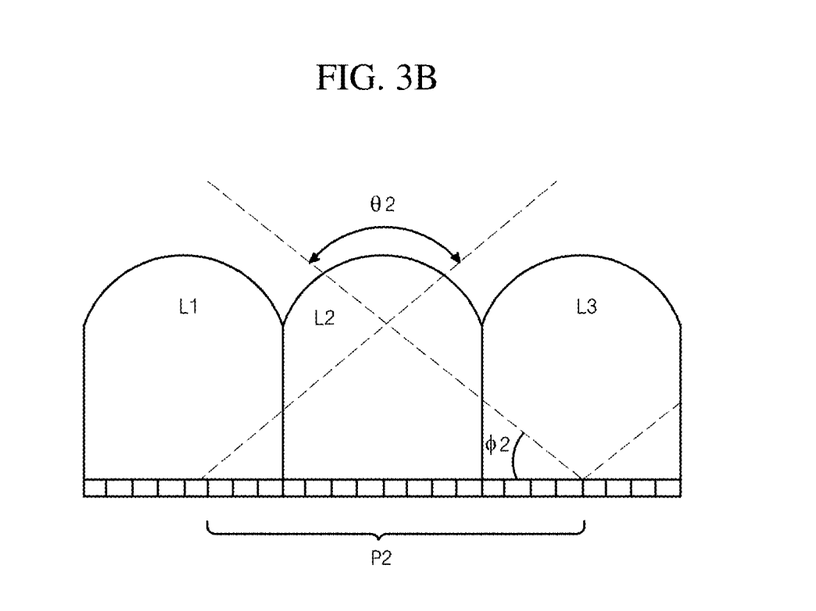
FIG. 3B is a view showing a second subpixel group in a region under a second lenticular lens and a region under first and third lenticular lenses of a light field display device according to a first aspect of the present disclosure.

FIG. 3A is a view showing a second subpixel group in a region under a second lenticular lens of a light field display device according to a comparison example, and FIG. 3B is a view showing a second subpixel group in a region under a second lenticular lens and a region under first and third lenticular lenses of a light field display device according to a first aspect of the present disclosure.

In FIG. 3A, a second subpixel group P2 is disposed only in a region under a second lenticular lens L2. All the light (or a light field) emitted from the second subpixel group P2 passes through the second lenticular lens L2. Light of an outermost subpixel SP of the second subpixel group P2 is emitted through the second lenticular lens L2 with a first emission angle φ1, and two lights of both outermost subpixels SP passing through the second lenticular lens L2 constitute a first viewing angle θ1. As a result, the light (or the light field) enters both eyes of a user in the first viewing angle θ1 and the user recognizes a three-dimensional image.

In FIG. 3B, a second subpixel group P2 is disposed in a region under first and third lenticular lenses L1 and L3 as well as in a region under second lenticular lens L2. The number of the subpixels in the second subpixel group P2 may be eight as in FIG. 3A or may be greater than eight.

In the light field display device 100 according to a first aspect of the present disclosure, a light of the subpixel SP under the second lenticular lens L2 passes through the second lenticular lens L2. Further, a light of the subpixel SP under the first and third lenticular lenses L1 and L3 passes through the second lenticular lens L2.

A light of an outermost subpixel SP of the second subpixel group P2, i.e., a light of the subpixel SP under the first and third lenticular lenses L1 and L3 is emitted through the second lenticular lens L2 with a second emission angle φ2. Since the first emission angle φ1 is greater than the second emission angle φ2 (φ1>φ2), the light of the outermost subpixel SP of the second subpixel group P2 passes through the second lenticular lens L2 with a wider emission angle as compared with the light of FIG. 3A. As a result, a second viewing angle θ2 by two lights of both outermost subpixels SP passing through the second lenticular lens L2 of the light field display device 100 increases as compared with the first viewing angle θ1 of FIG. 3A.

The second subpixel group P2 is disposed in a region under second lenticular lens L2 and extends to a region under first and third lenticular lenses L1 and L3. As a result, the viewing angle θ2 is improved.

The second viewing angle θ2 is inversely proportional to the second emission angle θ2 of the light from the outermost subpixel SP of the second subpixel group P2 to the second lenticular lens L2, and the second emission angle θ2 varies according to a position of the subpixel SP under the first and second lenticular lenses L1 and L3 adjacent to the second lenticular lens L2. Accordingly, the second viewing angel θ2 may be adjusted by changing the position of the subpixel SP under the first and third lenticular lens L1 and L3 adjacent to the second lenticular lens L2.

Referring again to FIG. 2, a first insulating layer 115 and a second insulating layer 116 are disposed on the display panel 110. A first barrier 121 is disposed on the first insulating layer 115, and a second barrier 124 is disposed on the second insulating layer 116.

The first insulating layer 116 may be an encapsulation layer sealing the display panel 110. When the first insulating layer 116 is an encapsulation layer, the first insulating layer 116 may include a single layer of an inorganic layer, a double layer of an inorganic layer and an organic layer or a triple layer of an inorganic layer, an organic layer and an inorganic layer. Although the inorganic layer may include an inorganic material such as silicon nitride (SiNx) or silicon oxide (SiOx), it is not limited thereto. Although the organic layer may include an organic material such as polyethyleneterephthalate (PET), polyethylenenaphthalate (PEN), polycarbonate (PC), polyimide (PI), polyethylenesulfonate (PES), polyoxymethylene (POM) or polyarylate (PAR) or a mixture thereof, it is not limited thereto.

The second insulating layer 116 may include an organic material. Although the second insulating layer 116 may include the same material as the first insulating layer 115, it is not limited thereto.

Specifically, the second insulating layer 116 may have the same refractive index as the first insulating layer 115.

A third insulating layer 118 is disposed between the display panel 110 and the lenticular lens array 130. The third insulating layer 118 may include an organic material. Although the third insulating layer 118 may include the same material as the first insulating layer 115 and the second insulating layer 116, it is not limited thereto. Specifically, the third insulating layer 118 may have the same refractive index as the first insulating layer 115 and the second insulating layer 116.

Although the first barrier 121 and the second barrier 124 may include an opaque metal such as titanium oxide (TiOx) or a black resin, it is not limited thereto.

The first barrier 121 and the second barrier 124 are a light path controlling part adjusting a path of a light emitted from the subpixel SP. The first barrier 121 and the second barrier 124 include a first slit S1 and a second slit S2, respectively, disposed with a gap. The light transmitted to the lenticular lens L2 and L4 among a light emitted from the subpixel group P2 and P4 passes through the first slit S1 and the second slit S2, and the light transmitted to the different region is blocked by the first barrier 121 and the second barrier 124. As a result, the light emitted from the subpixel group P2 and P4 enters only the corresponding lenticular lens L2 and L4.

Figure 4:
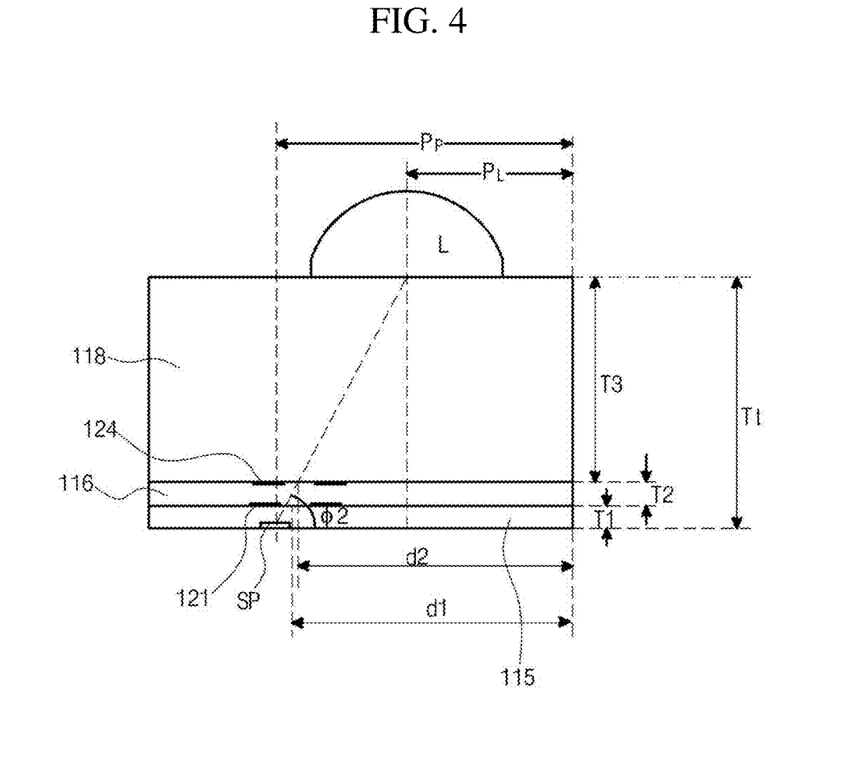
FIG. 4 is a magnified view showing a portion of FIG. 2.

FIG. 4 is a magnified view showing a portion of FIG. 2 and shows one lenticular lens L of a lenticular lens array 130 and a display panel 110.

In FIG. 4, the first insulating layer 115 has a first thickness T1, the second insulating layer 116 has a second thickness T2, and the third insulating layer 118 has a third thickness T3. For example, the first thickness T1 may be within a range of about 8 µm to about 12 µm (preferably about 10 µm), the second thickness T2 may be within a range of about 16 µm to about 24 µm (preferably about 20 µm), and the third thickness T3 may be within a range of about 360 µm to about 400 µm (preferably about 200 µm). As a result, a total thickness Tt of the first insulating layer 115, the second insulating layer 116 and the third insulating layer 118, i.e., a distance between the lenticular lens L and the subpixel SP of the subpixel group P may be within a range of about 384 µm to about 476 µm (preferably about 430 µm).

The second emission angle φ2 of the light emitted from the outermost subpixel SP of the subpixel group P (the subpixel under the adjacent lenticular lens) to a center of the lenticular lens L may be expressed as following equation 1.

$$\tan \varphi 2 = (T1+T2+T3)/(P_P - P_L)$$ [EQUATION 1]

Here, $P_P$ is a width of the subpixel group P, and $P_L$ is a distance between a center of the lenticular lens L and an edge of the subpixel group P.

A first distance d1 between the edge of the subpixel group P and a center of an opening of the first barrier 121 and a second distance d2 between the edge of the subpixel group P and a center of an opening of the second barrier 124 may be expressed as following equation 2.

$$d1 = P_P - (T1/\tan \varphi 2)$$

$$d2 = P_P - (T2/\tan \varphi 2)$$ [EQUATION 2]

Since the first barrier 121 and the second barrier 124 are disposed on the first insulating layer 115 and the second insulating layer 116, respectively, according to equation 2, the light of the subpixel group P enters the corresponding lenticular lens L and does not enter the adjacent lenticular lens.

In the light field display device 100 according to a first aspect of the present disclosure, the width of the subpixel group P is greater than the width of the lenticular lens, and the light of the subpixel group P enters the corresponding lenticular lens L due to the first barrier 121 and the second barrier 124. As a result, the viewing angle of the light field display device 100 is improved.

Although the first barrier 121 and the second barrier 124 are disposed on the display panel 110 in the first aspect, the first barrier 121 and the second barrier 124 may be disposed in the display panel 110 in another aspect.

Figure 5:
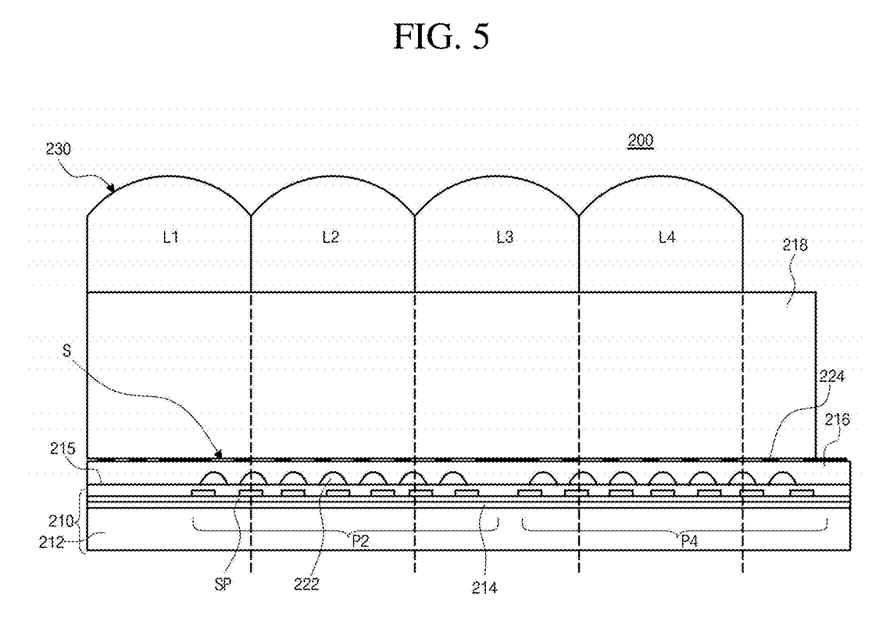
FIG. 5 is a view showing a light field display device according to a second aspect of the present disclosure.

FIG. 5 is a view showing a light field display device according to a second aspect of the present disclosure. Illustration on a part the same as a part of the first aspect may be omitted or may be briefed.

In FIG. 5, a light field display device 200 according to a second aspect of the present disclosure includes a display panel 210 having a plurality of subpixels SP and a lenticular lens array 230 on the display panel 210.

A plurality of subpixel groups P2 and P4 each including the plurality of subpixels SP emitting a light field (a light) of the same color are disposed in the display panel 210. The lenticular lens array 230 includes a plurality of lenticular lens L1, L2, L3 and L4, and the light field of each subpixel group P2 and P4 enters the corresponding lenticular lens L1, L2, L3 and L4.

A light path controlling part is disposed on the display panel 210. The light path controlling part adjusts a path of a light field such that the light field emitted from the subpixel group P2 and P4 enters the corresponding lenticular lens L1, L2, L3 and L4.

The light path controlling part includes a plurality of lenses 222 on a first insulating layer 215 and a barrier 224 on a second insulating layer 216. The plurality of lenses 222 may be formed of a plastic material and may include a lenticular lens of a half cylindrical shape or a lens of a half spherical shape. The barrier 224 may be formed of an opaque metal such as titanium oxide (TiOx) or a black resin.

The plurality of lenses 222 refracts the light field emitted from the subpixel SP toward a predetermined direction. The barrier 224 has a slit S such that a light passing through the plurality of lenses 222 is selectively transmitted or blocked by the barrier 224. As a result, the light field of the subpixel SP enters the corresponding lenticular lens L1, L2, L3 and L4 due to the barrier 222.

While the light path controlling part includes the first barrier 121 and the second barrier 124 in the first aspect, the light path controlling part includes the plurality of lenses 222 and the barrier 224 in the second aspect.

Figure 6A:
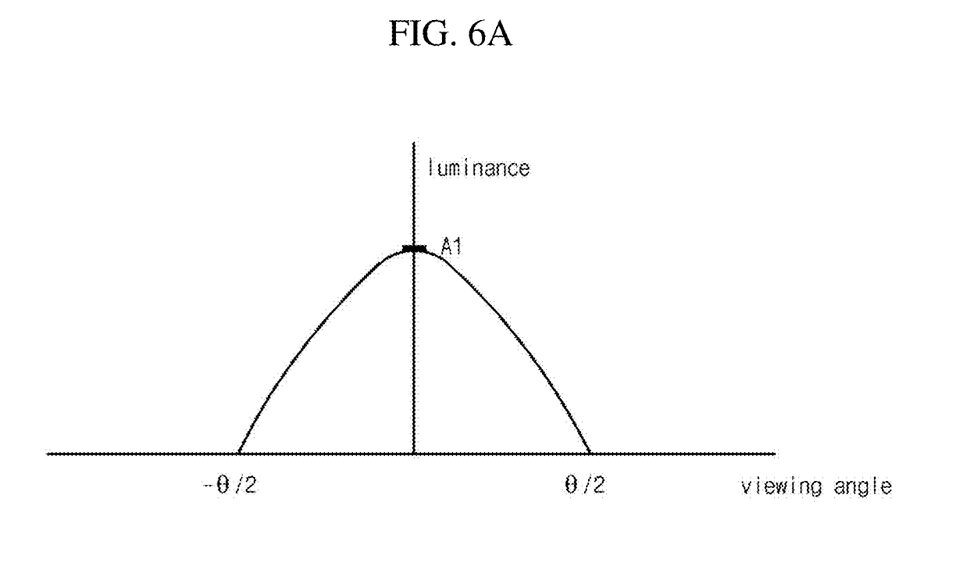
FIGS. 6A and 6B are views showing luminance of light passing through a light path controlling part and entering a lenticular lens array of a light field display device according to a first aspect and a second aspect, respectively, of the present disclosure.
Figure 6B:
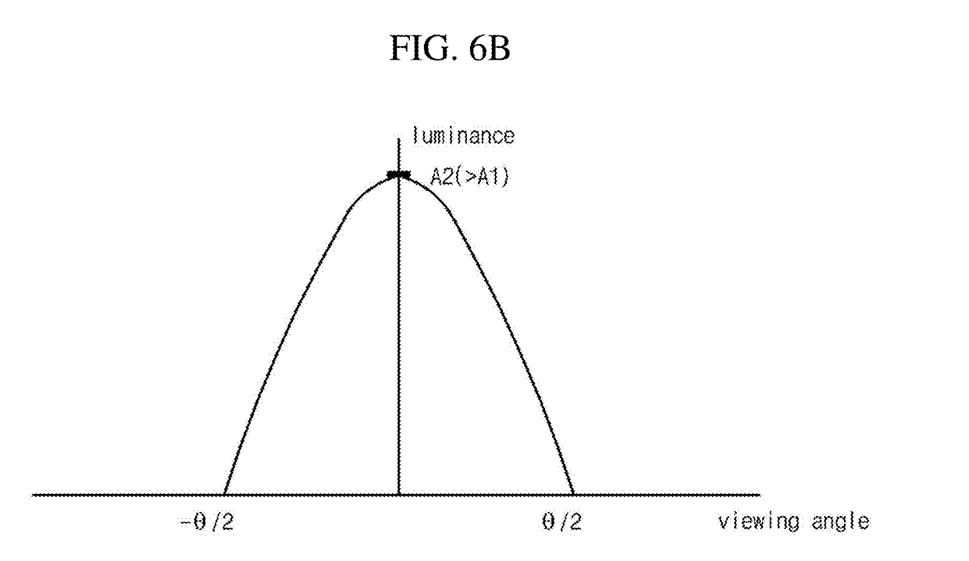

FIGS. 6A and 6B are views showing a luminance of a light passing through a light path controlling part and entering a lenticular lens array of a light field display device according to a first aspect and a second aspect, respectively, of the present disclosure.

In FIGS. 6A and 6B, while two barriers 121 and 124 selectively transmitting and blocking light are disposed in the first aspect, one barrier 224 is disposed in the second aspect. As a result, the light blocked by the barrier of the light field display device 200 of the second aspect is reduced as compared with the light blocked by the barrier of the light field display device 100 of the first aspect. Since the amount of light blocked by the light path controlling part is reduced, a luminance of the light field display device 200 of the second aspect increases as compared with a luminance of the light field display device 100 of the first aspect. Specifically, while a luminance of the light field display device 200 of the second aspect is similar to a luminance of the light field display device 100 of the first aspect in an edge region of a viewing angle, a luminance of the light field display device 200 of the second aspect is greater than a luminance of the light field display device 100 of the first aspect in a central region of a viewing angle.

Figure 7:
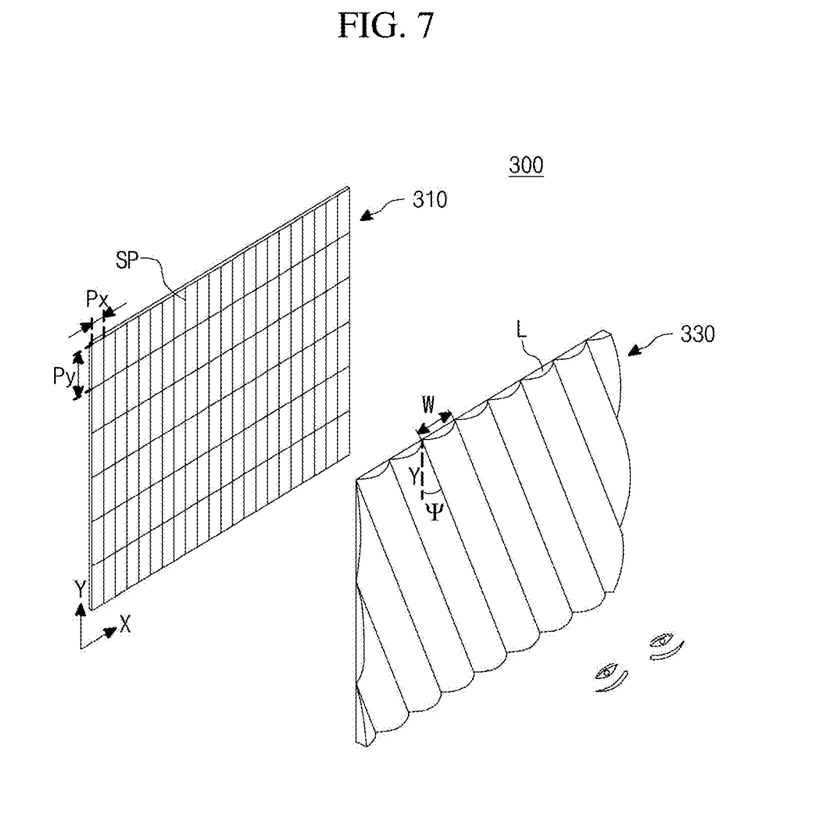
FIG. 7 is a view showing a light field display device according to a third aspect of the present disclosure.

FIG. 7 is a view showing a light field display device according to a third aspect of the present disclosure.

In FIG. 7, a light field display device 300 according to a third aspect of the present disclosure includes a display panel 310 having a plurality of subpixels SP and a lenticular lens array 330 on the display panel 310.

Although not shown, red, green and blue subpixels SP may be disposed along a horizontal direction (an x direction) and may emit a multiple light field having first to n-th light fields (n is a natural number equal to or greater than 2). A plurality of cameras are disposed along an angular resolution of divergent angles of the light fields and shoot an object to generate the multiple light field. For example, when an object is shot by eight cameras, the display panel 310 may emit eight light fields to constitute eight views. When an object is shot by twenty-eight cameras, the display panel 310 may emit twenty-eight light fields to constitute twenty-eight views.

The lenticular lens array 330 including a plurality of lenticular lenses L is disposed on the entire display panel 310.

The plurality of lenticular lenses L of the lenticular lens array 330 are disposed to have an inclined shape having a slanting angle Ψ with respect to a vertical direction (a y direction). A horizontal width w along a horizontal direction (an x direction) of each lenticular lens L may be determined as an integer multiple of a horizontal side Px of each subpixel SP.

In the light field display device 300 according to a third aspect of the present disclosure, the lenticular lens L of the lenticular lens array 120 is disposed to be inclined with a slanting angle Ψ with respect to a vertical direction (a y direction). As a result, distortion of an image due to a great difference between resolutions along the horizontal and vertical directions of a three-dimensional image is prevented.

Figure 8:
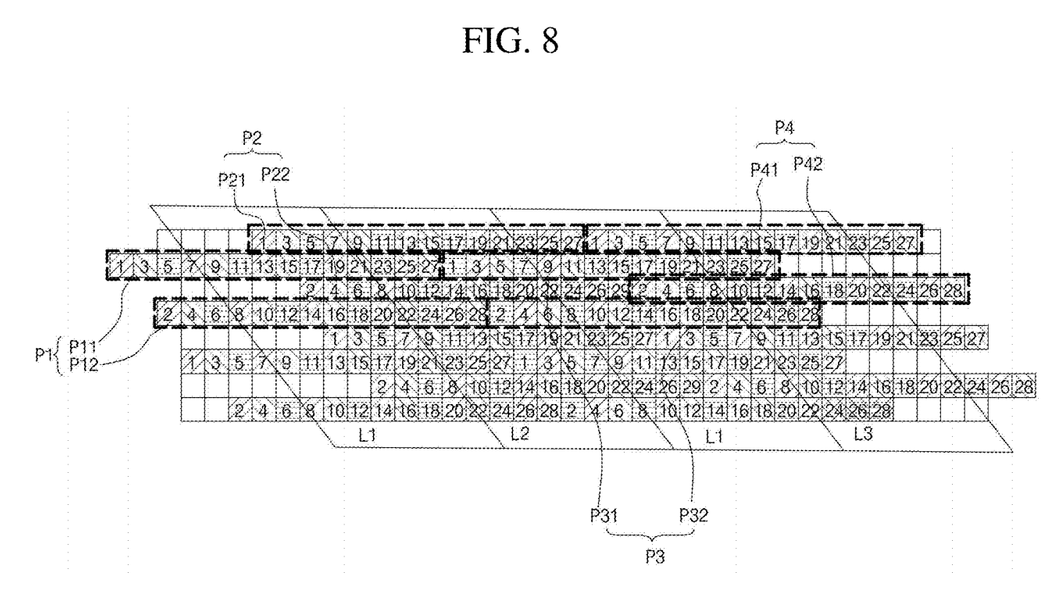
FIG. 8 is a plan view showing a plurality of subpixel groups and a lenticular lens array of a light field display device according to a third aspect of the present disclosure.

FIG. 8 is a plan view showing a plurality of subpixel groups and a lenticular lens array of a light field display device according to a third aspect of the present disclosure.

In FIG. 8, the plurality of subpixel groups P1, P2, P3 and P4 each including the plurality of subpixels SP are disposed in an odd horizontal subpixel line and an even horizontal subpixel line. For example, each of the first subpixel group P1 and the third subpixel group P3 may be disposed in an even horizontal subpixel line, and each of the second subpixel group P2 and the fourth subpixel group P4 may be disposed in an odd horizontal subpixel line. The red, green and blue subpixels SP are disposed to be alternately repeated in each subpixel group P1, P2, P3 and P4.

The lenticular lens array 330 inclined with a slanting angle Ψ is disposed on the first to fourth subpixel groups P1, P2, P3 and P4, and first to fourth lenticular lenses L1, L2, L3 and L4 are disposed to be repeated in the lenticular lens array 330.

For example, the first, second, third and fourth subpixel groups P1, P2, P3 and P4 correspond to the first, second, third and fourth lenticular lenses L1, L2, L3 and L4, respectively.

Each of the first, second, third and fourth subpixel groups P1, P2, P3 and P4 may include twenty-eight subpixels SP. As a result, light emitted from the twenty-eight subpixels SP is divided by the first, second, third and fourth lenticular lenses L1, L2, L3 and L4 to constitute twenty-eight views of a multi-view.

Each subpixel group P1, P2, P3 and P4 may include two subpixel lines P11, P12, P21, P22, P31, P32, P41 and P42. For example, the first subpixel group P1 may include a first-first subpixel line P11 in a first even horizontal line and a first-second subpixel line P12 in a second even horizontal line. The second subpixel group P2 may include a second-first subpixel line P21 in a first odd horizontal line and a second-second subpixel line P22 in a second odd horizontal line. The third subpixel group P3 may include a third-first subpixel line P31 in a first even horizontal line and a third-second subpixel line P32 in a second even horizontal line. The fourth subpixel group P4 may include a fourth-first subpixel line P41 in a first odd horizontal line and a fourth-second subpixel line P42 in a second odd horizontal line.

Each of the first, second, third and fourth subpixel groups P1, P2, P3 and P4 includes twenty-eight subpixels SP, and each of the first-first, first-second, second-first, second-second, third-first, third-second, fourth-first and fourth-second subpixel lines P11, P12, P21, P22, P31, P32, P41 and P42 includes fourteen subpixels SP. However, it is not limited thereto, and a number of the subpixels may vary according to a number of the views of the light field display device 300.

Each of the first-first, first-second, second-first, second-second, third-first, third-second, fourth-first and fourth-second subpixel lines P11, P12, P21, P22, P31, P32, P41 and P42 has a width greater than a width of the corresponding lenticular lens L1, L2, L3 and L4. For example, seven subpixels SP of the second-first subpixel line P21 and the second-second subpixel line P22 may be disposed in a region corresponding to the second lenticular lens L2, and seven subpixels SP of the second-first subpixel line P21 and the second-second subpixel line P22 may be disposed in a region corresponding to the first and third lenticular lenses L1 and L3.

Since each subpixel line P11, P12, P21, P22, P31, P32, P41 and P42 has a width greater than a width of the corresponding lenticular lens L1, L2, L3 and L4, an incident angle of the light field emitted from each subpixel line P11, P12, P21, P22, P31, P32, P41 and P42 to the corresponding lenticular lens L1, L2, L3 and L4 is reduced, and a viewing angle of the light field passing through the lenticular lens L1, L2, L3 and L4 increases.

In the light field display device 300, since each subpixel group P1, P2, P3 and P4 includes two subpixel lines in different horizontal lines, the two subpixel lines constitute the multi-view.

In addition, since the different subpixel groups are disposed in the odd horizontal line and the even horizontal line, the multi-view is constituted by adjusting the subpixel group of the odd horizontal line and the subpixel group of the even horizontal line individually.

For example, the light fields emitted from the first subpixel group P1 and the third subpixel group P3 in the two even horizontal lines may be divided into the multi-view by the first lenticular lens L1 and the third lenticular lens L3.

Further, the light fields emitted from the second subpixel group P2 and the fourth subpixel group P4 in the two odd horizontal lines may be divided into the multi-view by the second lenticular lens L2 and the fourth lenticular lens L4.

Figure 9:
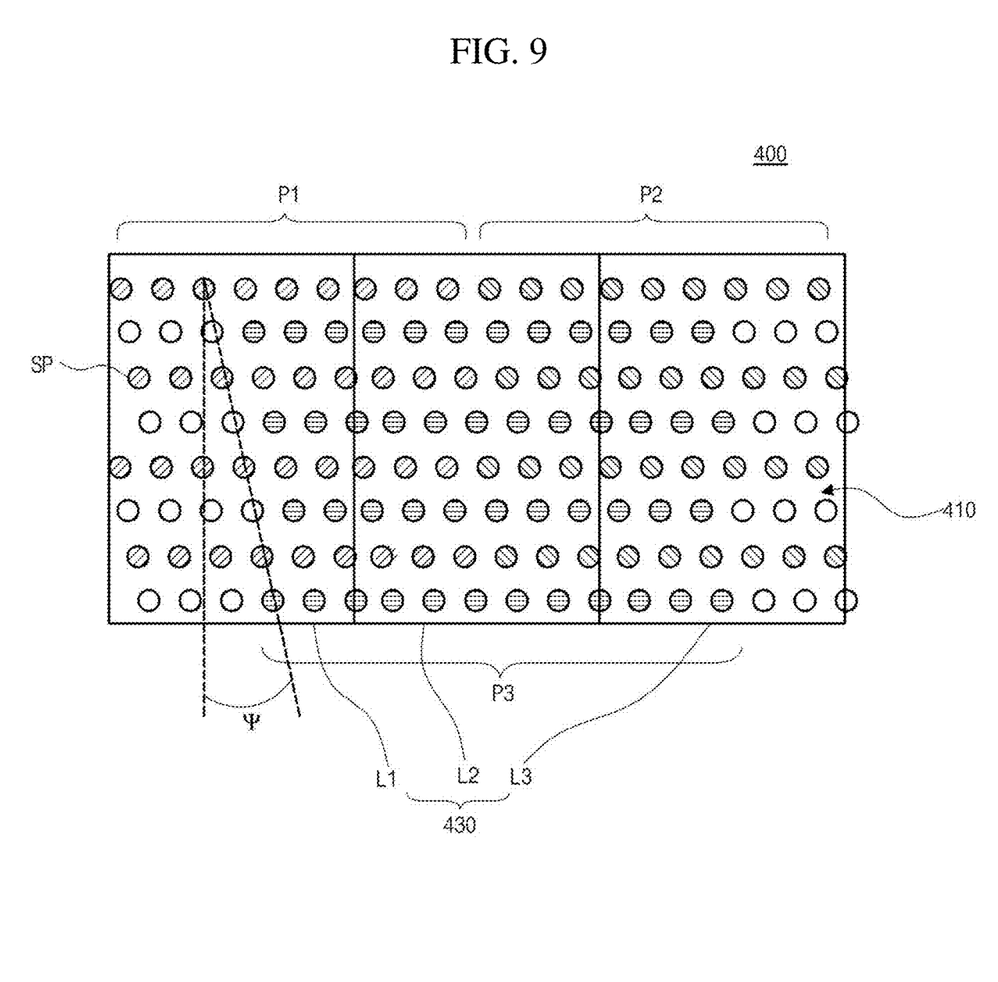
FIG. 9 is a view showing a light field display device according to a fourth aspect of the present disclosure.

FIG. 9 is a view showing a light field display device according to a fourth aspect of the present disclosure.

In FIG. 9, a plurality of subpixel groups P1, P2 and P3 are disposed to be relatively inclined with respect to a lenticular lens array 430. While the subpixel groups P1, P2 and P3 are disposed along a vertical direction (a y direction) and the lenticular lens array 430 is disposed to be inclined with a predetermined slanting angle Ψ in the light field display device 300 of FIG. 8, the lenticular lens array 430 is disposed along a vertical direction (a y direction) and the plurality of subpixel groups P1, P2 and P3 are disposed to be inclined with a predetermined slanting angle T.

Since each of the first, second and third subpixel groups P1, P2 and P3 has a width greater than a width of the corresponding lenticular lens L1, L2 and L3, an incident angle of the light field emitted from each subpixel group P1, P2 and P3 to the corresponding lenticular lens L1, L2 and L3 is reduced, and a viewing angle of the light field passing through the lenticular lens L1, L2 and L3 increases.

Figure 10:
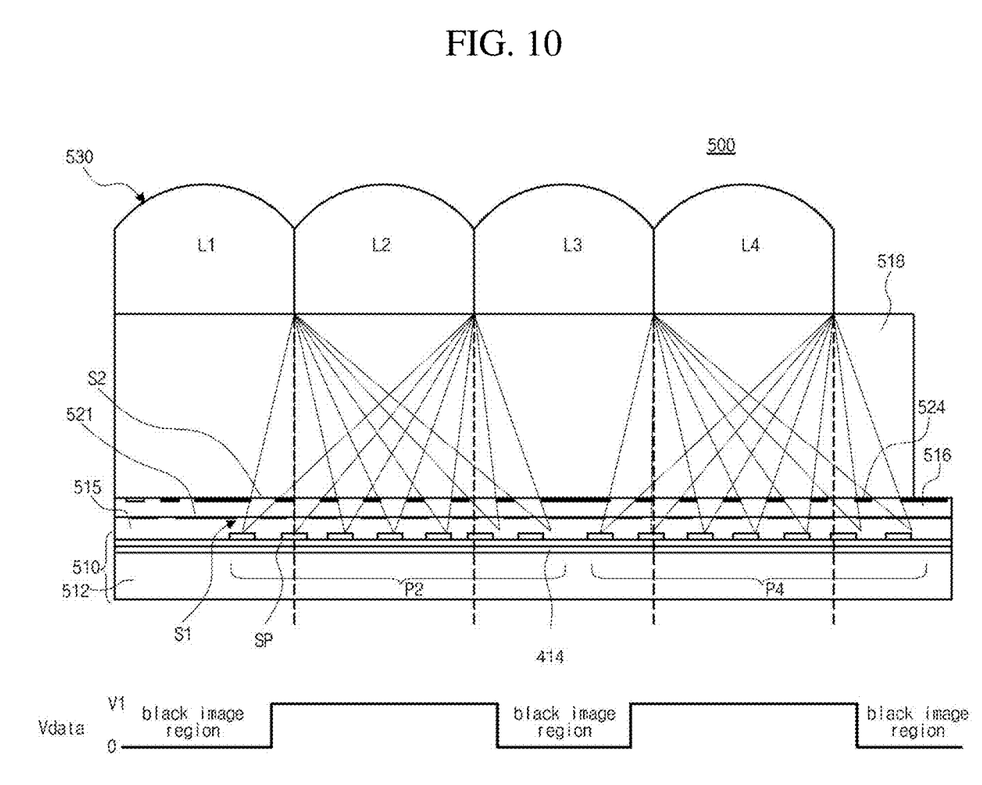
FIG. 10 is a view showing a light field display device according to a fifth aspect of the present disclosure.

FIG. 10 is a view showing a light field display device according to a fifth aspect of the present disclosure. A light field display device 500 according to a fifth aspect of the present disclosure has the same structure as the light field display device 100 according to a first aspect of the present disclosure of FIG. 2, while signals applied to the light field display device 500 according to a fifth aspect are different from signals applied to the light field display device 100 according to a first aspect. Illustration on a part the same as a part of the first aspect may be omitted or may be briefed.

In FIG. 10, each subpixel group P2 and P4 of a light field display device 500 has a width greater than a width of the corresponding lenticular lens L2 and L4. For example, the subpixel of the second subpixel group P2 may be disposed under the adjacent first and third lenticular lenses L1 and L3 as well as under the corresponding second lenticular lens L2. Since a light emitted from the outermost subpixel SP of the second subpixel group P2 passes through the second lenticular lens L2 with a narrower angle, a viewing angle of the light field display device 500 is improved.

An image data of a first voltage V1 is applied to each subpixel SP in the subpixel group P2 and P4. Since a black image region displaying black is generated at both sides of the subpixel group P2 and P4 extending under the adjacent lenticular lens, generation of a three-dimensional crosstalk is prevented.

When the image data of the first voltage V1 is applied to the subpixels SP of the second and fourth subpixel groups P2 and P4, the subpixels SP emit a light field. The light field of the subpixel SP of the second subpixel group P2 is emitted through the second lenticular lens L2, and the light field of the subpixel SP of the fourth subpixel group P4 is emitted through the fourth lenticular lens L4.

The black image region is disposed at both sides of the second subpixel group P2 and both sides of the fourth subpixel group P4. Although the black image region includes only the outermost subpixel SP of the second and fourth subpixel groups P2 and P4 in the fifth aspect, the black image region may include a plurality of subpixels SP in another aspect. Further, the black image region may include a subpixel SP under the second and fourth lenticular lenses L2 and L4 in another aspect.

Since an image data of a black, for example, 0V is applied to the subpixel SP in the black image region, generation of a three-dimensional crosstalk in direction of right and left viewing angles is prevented.

When images of different viewpoints are superimposed at a specific viewing angle, three-dimensional crosstalk may be recognized. For example, the three-dimensional crosstalk may not be recognized at a front viewing angle and may be recognized at right and left viewing angles. Specifically, when a viewing angle increases, the three-dimensional crosstalk at the right and left viewing angles may be severely generated.

In the light field display device 500, each subpixel group P2 and P4 has a width greater than a width of the corresponding lenticular lens L2 and L4, and the black image region displaying black is generated at both sides of each subpixel groups P2 and P4. As a result, the viewing angle is improved without generation of a three-dimensional crosstalk.

Figure 11:
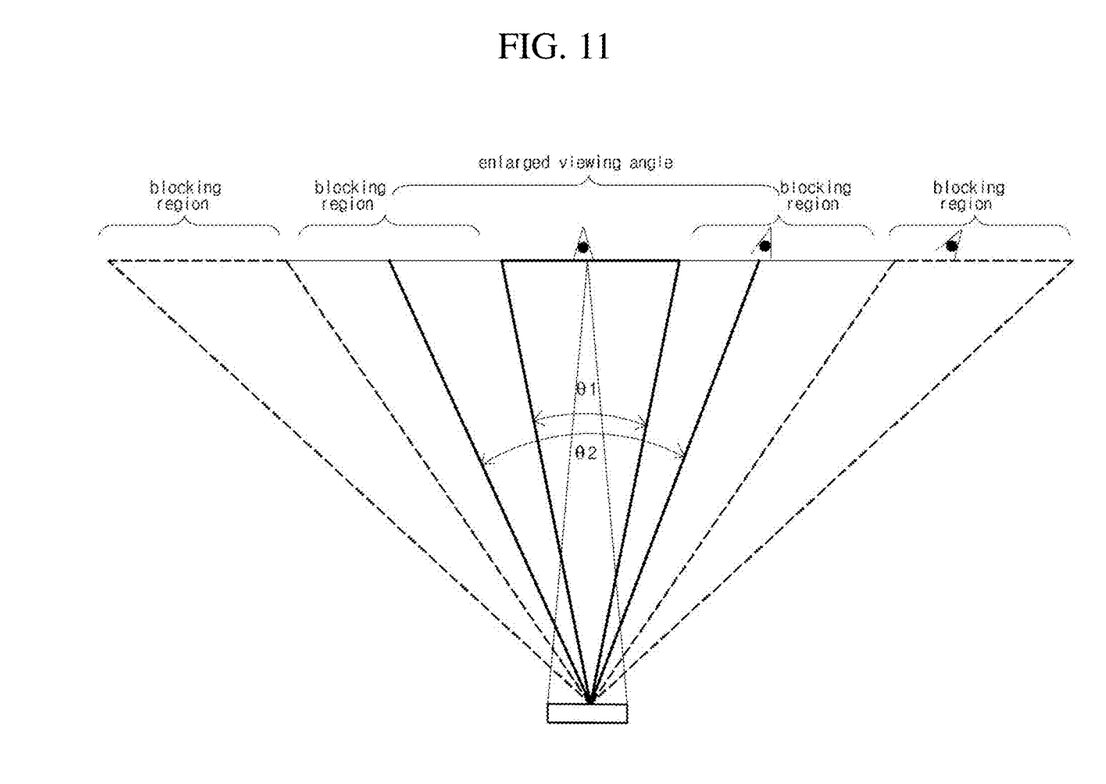
FIG. 11 is a view showing a viewing angle of a light field display device according to a fifth aspect of the present disclosure.

FIG. 11 is a view showing a viewing angle of a light field display device according to a fifth aspect of the present disclosure.

In FIG. 11, a light field emitted from the display panel of a comparison example of FIG. 3 has a first viewing angle θ1. Since the subpixel groups of the display panel extends to outsides of the corresponding lenticular lens, a light field emitted from the display panel of a fifth aspect has an enlarged second viewing angle θ2 greater than the first viewing angle θ1 (θ2>θ1).

The black image region is generated at both sides of the subpixel group, and the image data of black is applied to the subpixel SP of the black image region to display black. The black image region includes a region corresponding to a portion of the second viewing angle θ2 and a region corresponding to a portion outside the second viewing angle θ2. The three-dimensional crosstalk at right and left viewing angles is prevented due to the black image region.

Further, since the light field passing through a region outside the black image region is blocked by the light path controlling part of FIGS. 2 and 5, deterioration of the light field display device due to the light field passing through a region outside the black image region is prevented.

In the light field display device 500 according to a fifth aspect of the present disclosure, since the black image region as well as the light path controlling part are formed, emission of the light field through a region outside the viewing angle region is prevented and generation of the three-dimensional crosstalk is effectively prevented.

Consequently, in the light field display device according to the present disclosure, the subpixels of the subpixel groups transmitting the light field are disposed under the adjacent lenticular lens as well as under the corresponding lenticular lens. As a result, the viewing angle is improved.

Further, the lenticular lenses of the lenticular lens array are disposed to be inclined with the slanting angle with respect to the vertical direction of the subpixels. As a result, distortion of the three-dimensional image due to resolution difference between the horizontal and vertical directions is prevented.

In addition, the black image regions displaying a black are disposed at both sides of the corresponding subpixel group. As a result, generation of the three-dimensional crosstalk at the right and left directions is prevented.

It will be apparent to those skilled in the art that various modifications and variation can be made in the present disclosure without departing from the spirit or scope of the disclosure. Thus, it is intended that the present disclosure cover the modifications and variations of this disclosure provided they come within the scope of the appended claims and their equivalents.

What is claimed is:

1. A light field display device, comprising:
   a display panel including a plurality of subpixels each configured to emit a light field; and
   a lenticular lens array on the display panel, the lenticular lens array including a plurality of lenticular lenses having a first lenticular lens and a second lenticular lens,
   wherein the plurality of subpixels are arranged into a plurality of subpixel groups including a first pixel group having first subpixels from the plurality of subpixels, and the plurality of lenticular lenses correspond to the plurality of subpixel groups,
   wherein a width of each of the plurality of subpixel groups is greater than a width of each of the plurality of lenticular lenses such that the first pixel group overlaps both the first lenticular lens and the second lenticular lens, and
   wherein the light fields emitted from the plurality of subpixels of one of the plurality of subpixel groups pass through one of the plurality of lenticular lenses such that a light field emitted by the first pixel group passes through the first lenticular lens but not the second lenticular lens even though the first pixel group overlaps both the first lenticular lens and the second lenticular lens.

2. The device of claim 1, wherein the plurality of subpixel groups comprise:
   a plurality of first subpixel groups in odd horizontal subpixel lines; and
   a plurality of second subpixel groups in even horizontal subpixel lines.

3. The device of claim 2, wherein the plurality of first subpixel groups comprise:
   a first subpixel line in a first odd horizontal subpixel line and including the plurality of subpixels; and
   a second subpixel line in a second odd horizontal subpixel line and including the plurality of subpixels.

4. The device of claim 2, wherein the plurality of second subpixel groups comprise:
   a third subpixel line in a first even horizontal subpixel line and including the plurality of subpixels; and
   a fourth subpixel line in a second even horizontal subpixel line and including the plurality of subpixels.

5. The device of claim 1, further comprising a light path controlling part adjusting a path of the light field emitted from the plurality of subpixel groups and transmitting the light field to the plurality of lenticular lenses.

6. The device of claim 5, wherein the light path controlling part is disposed in the display panel.

7. The device of claim 5, wherein the light path controlling part is disposed between the display panel and the lenticular lens array.

8. The device of claim 5, wherein the light path controlling part comprises:
   a first barrier selectively blocking or transmitting the light field emitted from the display panel; and
   a second barrier selectively blocking or transmitting the light field passing through the first barrier.

9. The device of claim 8, further comprising:
   a first insulating layer between the display panel and the first barrier;
   a second insulating layer between the first and second barriers; and
   a third insulating layer between the second barrier and the lenticular lens array,
   wherein the first, second and third insulating layers have a same refractive index as each other.

10. The device of claim 5, wherein the light path controlling part comprises:
    a lens refracting the light field emitted from the display panel; and
    a barrier selectively blocking or transmitting the light field refracted by the lens.

11. The device of claim 1, wherein the plurality of subpixel groups and the plurality of lenticular lenses cross each other with a slanting angle.

12. The device of claim 11, wherein the plurality of lenticular lenses are inclined with respect to a vertical direction of the plurality of subpixel groups.

13. The device of claim 11, wherein the plurality of subpixel groups are inclined with respect to a vertical direction of the plurality of lenticular lenses.

14. The device of claim 1, further comprising a light emitting diode that has an emission area corresponding to the at least one lens pattern.

15. The device of claim 1, wherein a black image region displaying a black is disposed at both sides of each of the plurality of subpixel groups.

16. The device of claim 1, wherein the display panel includes one of a liquid crystal display panel, an organic light emitting diode display panel, a plasma display panel, an electrophoretic display panel, a quantum dot display panel, a mini light emitting diode display panel and a micro light emitting diode display panel.

17. The device of claim 1, wherein the plurality of lenticular lenses include the first lenticular lens, the second lenticular lens and a third lenticular lens, and the plurality of subpixel groups include the first pixel group, a second pixel group and a third subpixel group corresponding to the first lenticular lens, the second lenticular lens and the third lenticular lens, respectively,
    wherein the plurality of subpixels of the first subpixel group include first, second and third subpixels disposed under the first lenticular lens, the second lenticular lens, and the third lenticular lens, respectively, and
    wherein the light fields emitted from the first subpixel, the second subpixel, and the third subpixel pass through the first lenticular lens without passing through the second lenticular lens and the third lenticular lens.

* * * * *